United States Patent
Park et al.

[11] Patent Number: 6,043,442
[45] Date of Patent: Mar. 28, 2000

[54] HANDLER CONTACT CHECKING DEVICE AND A METHOD OF TESTING INTEGRATED CIRCUIT DEVICES

[75] Inventors: Won Sik Park, Seoul; Weon Seob Shim, Cheonan; Chan Ho Choi, Cheonan; Yong Su Kwon, Cheonan, all of Rep. of Korea

[73] Assignee: Samsung Electronics Co., Ltd., Suwon, Rep. of Korea

[21] Appl. No.: 08/805,654

[22] Filed: Feb. 27, 1997

[30] Foreign Application Priority Data

Feb. 29, 1996 [KR] Rep. of Korea ............... 96-5283

[51] Int. Cl.⁷ ............................................. B07C 5/344
[52] U.S. Cl. ..................... 209/573; 209/571; 324/158.1
[58] Field of Search ............................. 209/571–575; 324/158.1, 754, 765

[56] References Cited

U.S. PATENT DOCUMENTS

| | | | |
|---|---|---|---|
| 3,599,092 | 8/1971 | Silverman | 324/158.1 |
| 3,662,881 | 5/1972 | Fineran | 209/655 |
| 3,665,504 | 5/1972 | Silverman | 324/158.1 |
| 3,716,786 | 2/1973 | Gearin | 209/573 |
| 3,896,935 | 7/1975 | Hjelle et al. | 209/573 |
| 4,639,664 | 1/1987 | Chiu et al. | 209/573 |
| 4,918,374 | 4/1990 | Stewart et al. | 324/758 |
| 5,057,772 | 10/1991 | Bruno et al. | 324/754 |
| 5,313,156 | 5/1994 | Klug et al. | 209/573 |
| 5,465,850 | 11/1995 | Kase | 209/573 |
| 5,539,305 | 7/1996 | Botka | 324/158.1 |
| 5,561,377 | 10/1996 | Strid et al. | 324/754 |
| 5,657,394 | 8/1997 | Schwartz et al. | 324/151 |
| 5,788,084 | 8/1998 | Onishi et al. | 209/573 |
| 5,865,319 | 2/1999 | Okuda et al. | 209/571 |

FOREIGN PATENT DOCUMENTS

| | | |
|---|---|---|
| 57-120869 | 7/1982 | Japan . |
| 4-148542 | 5/1992 | Japan . |
| 8-220172 | 8/1996 | Japan . |

*Primary Examiner*—Dean J. Kramer
*Assistant Examiner*—Thuy V. Tran
*Attorney, Agent, or Firm*—Jones Volentine, LLP

[57] ABSTRACT

A test method for testing an integrated circuit (IC) device, including a step of checking the handler contacts with IC devices to be tested after a test apparatus and a handler are completely set up and before actual testing operations commence. The handler contact check device includes a handler contact check board mounted to the handler, which is provided with a plurality of pins directly contacting outer terminals of the IC devices, and wiring circuits for transferring contact check electrical signals from a test apparatus to the contacts between the plurality of pins and the outer terminals, and for transferring output electrical signals from the contacts to the test apparatus, and a contact check package device having the same shape and outer terminals as the IC devices to be tested.

10 Claims, 7 Drawing Sheets

HANDLER CONTACT CHECKING DEVICE AND A METHOD OF TESTING INTEGRATED CIRCUIT DEVICES

BACKGROUND OF THE INVENTION

1. Field of the Invention

The present invention generally relates to the testing of integrated circuit devices, and more particularly to a handler contact checking device which can detect a contact failure between handler pins and terminals of the IC devices to be tested, and to a testing method using the handler contact checking device.

2. Description of the Related Arts

In general, integrated circuit devices are obtained by integrating multiple circuit elements into a single semiconductor substrate and then packaging the elements so as to provide electrical connection terminals and to protect the circuit elements from a hostile external environment. All of the packaged IC devices must be tested before shipment to verify that the IC devices exhibit the intended normal functions specified during the initial circuit design. In the testing process, a test system applies test signals to the IC devices to be tested and measures output signals from the IC devices. The term "test system" commonly refers to the combination of the hardware (test apparatus) for supplying the test signal and measuring the output signal, and the software (test program) for instructing and controlling the operations of the hardware.

Handling of the IC devices is carried out by a handler which automates the loading of devices to be tested, the fixing of IC devices under test, and the sorting of the tested devices. Signal communication between the test system and the IC devices is accomplished through the handler, and the handler has a number of pins directly contacting terminals of the IC devices. Accordingly, when the contacts are not accurately aligned, the signal communication between the test system and the IC devices becomes poor, and a normally functional IC device may incorrectly be sorted as a defective device. This in turn reduces the production yield of the test operation.

FIG. 1 is a failure management flow chart according to the prior art and describes the situation when contact failures between a handler and an IC device have occurred. In the start step 10, a test apparatus is set up in a stable state for actual testing operations. Next, a handler is set up in step 12, for example, by mounting a test board to provide signal communication between the test apparatus and the IC device. In preliminary test step 14, one IC device is loaded into the handler and a preliminary test is conducted according to a test program. The results of the preliminary test are analyzed to check the operating state or connection of the handler. If the handler is determined to be in a normal operating state, the test apparatus starts the actual testing of the IC devices by providing test signals in step 15. However, if the handler is in an abnormal operating state, the operator must determine the cause of the failure in step 16. If the handler failure is found to be a handler contact failure (step 17), the operator or engineer takes a proper action to correct the problem in step 18. The process flow 19 then returns to the handler contact preliminary test step 14, and repeats the steps described above. The failures found during the handler contact preliminary test may result from various causes, including functional errors in the handler itself, failures in test board connections or wiring circuits, and mis-mounting of the test board on the handler.

The above described prior art suffers some drawbacks. It is difficult to determine an optimal contact between the handler and the IC devices prior to the actual test. Further, when a handler contact failure is found, the contact located within the handler cannot be visually inspected and a proper checking tool is not available. Therefore, in order to remedy the contact failure, the test apparatus must be stopped prior to checking the handler contact. This increases the set up time of the test apparatus and the handler, which degrades the production yield of the IC devices.

SUMMARY OF THE INVENTION

It is an object of the present invention to improve the production yield of IC devices by checking the contacts between a handler and outer terminals of IC devices to be tested before the actual testing operation is commenced.

It is another object of the present invention to reduce the overall IC device test time by immediately solving a handler contact failure before the actual test operation commences.

To achieve these and other advantages, the present invention provides for a test method for testing an integrated circuit (IC) device, the test method comprising the steps of:

(A) setting up a test apparatus for providing power signals and test signals to the IC device, measuring output signals from the IC device, and determining whether the IC device meets predetermined operating standards;

(B) setting up a handler, which comprises pins for contacting external terminals of one of the IC device or a contact check package device, the handler operable for loading IC devices to be tested and sorting a tested IC device based on the operating standards in the determining step of the test apparatus;

(C) loading the contact check package device, having the same shape and external terminals as the IC device, into the handler;

(D) checking contact parts between the external terminals of the contact check package device and the pins of the handler;

(E) performing an actual test of the IC device to be tested by removing the contact check package device and loading the IC device to the handler; and (F) sorting the tested IC device depending on results of the performing step.

With the present invention, the handler contact check is accomplished by using a handler contact check device which comprises a handler contact check board mounted to the handler, which is provided with a plurality of pins directly contacting outer terminals of the IC devices, and wiring circuits for transferring contact check electrical signals from a test apparatus to the contacts between the plurality of pins and the outer terminals, and for transferring output electrical signals from the contacts to the test apparatus, and a contact check package device having the same shape and outer terminals as the IC devices to be tested.

BRIEF DESCRIPTION OF THE DRAWINGS

The above objects and advantages of the present invention are described further below, with reference to the accompanying drawings, in which.

DETAILED DESCRIPTION OF THE PREFERRED EMBODIMENT

Figure 1:
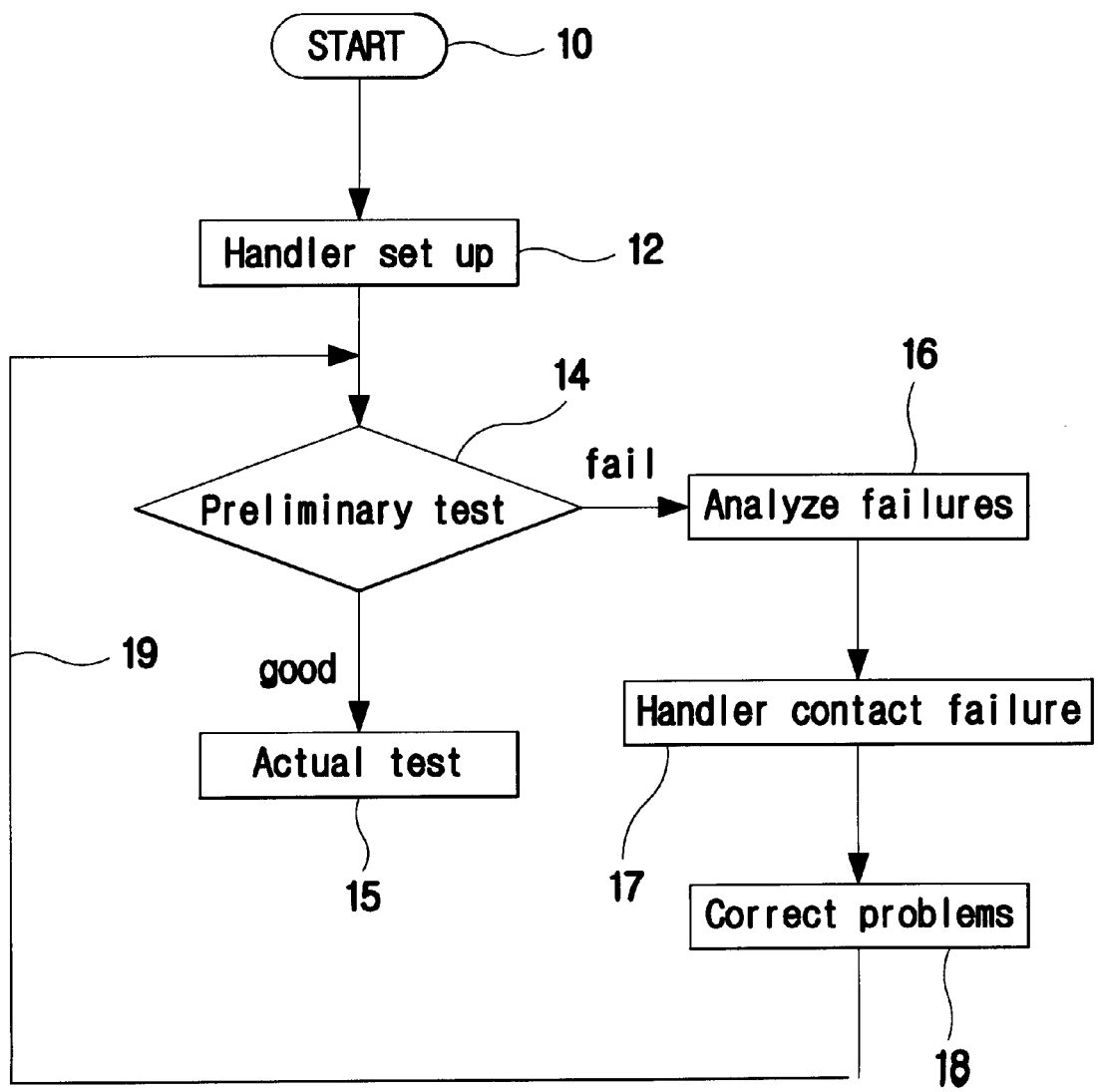
FIG. 1 is a failure management flow diagram according to the prior art when contact failures have occurred between a handler and an IC device to be tested.
Figure 2:
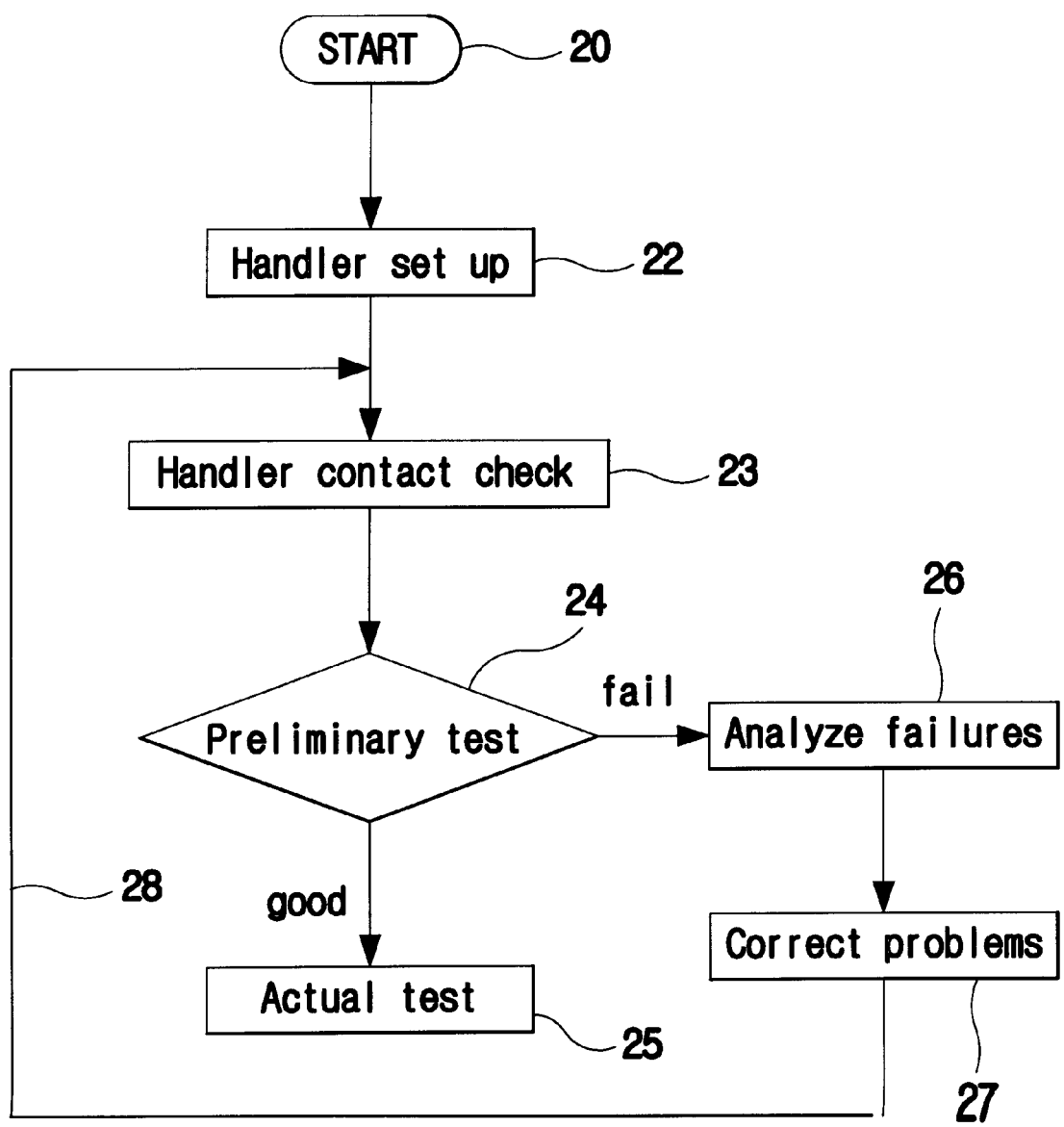
FIG. 2 is a failure management flow diagram according to the present invention when contact failures have occurred between a handler and an IC device to be tested.

FIG. 2 is a handler contact failure flow chart of the present invention. In the start step 20, a test apparatus is powered and set up into a suitable state for an actual testing operation. Then, a handler is set up in step 22 by mounting a handler contact check board and preparing the IC devices. When using the handler contact check board of the present invention, the contacts between the handler pins and the terminals of the IC devices are checked (step 23). If it is determined that the handler contacts are operating correctly, one IC device is loaded to the test station of the handler where a preliminarily test is carried out according to a test program to determine whether the handler itself is operating normally (step 24). If no problems are found in the handler, an actual testing operation is commenced (step 25). If, however, the handler does not pass the preliminary test of step 24, a maintenance operator or engineer must analyze and locate the cause of the handler failure (step 26), and then proper corrective actions are taken to solve the problem (step 27). The process flow then returns to the handler contact check step 23.

As explained above, since the present invention uses a handler contact checking device in step 23 before the actual testing operation commences in step 25, a handler contact failure can be found and solved immediately, which significantly reduces the overall test time.

Figure 3A:
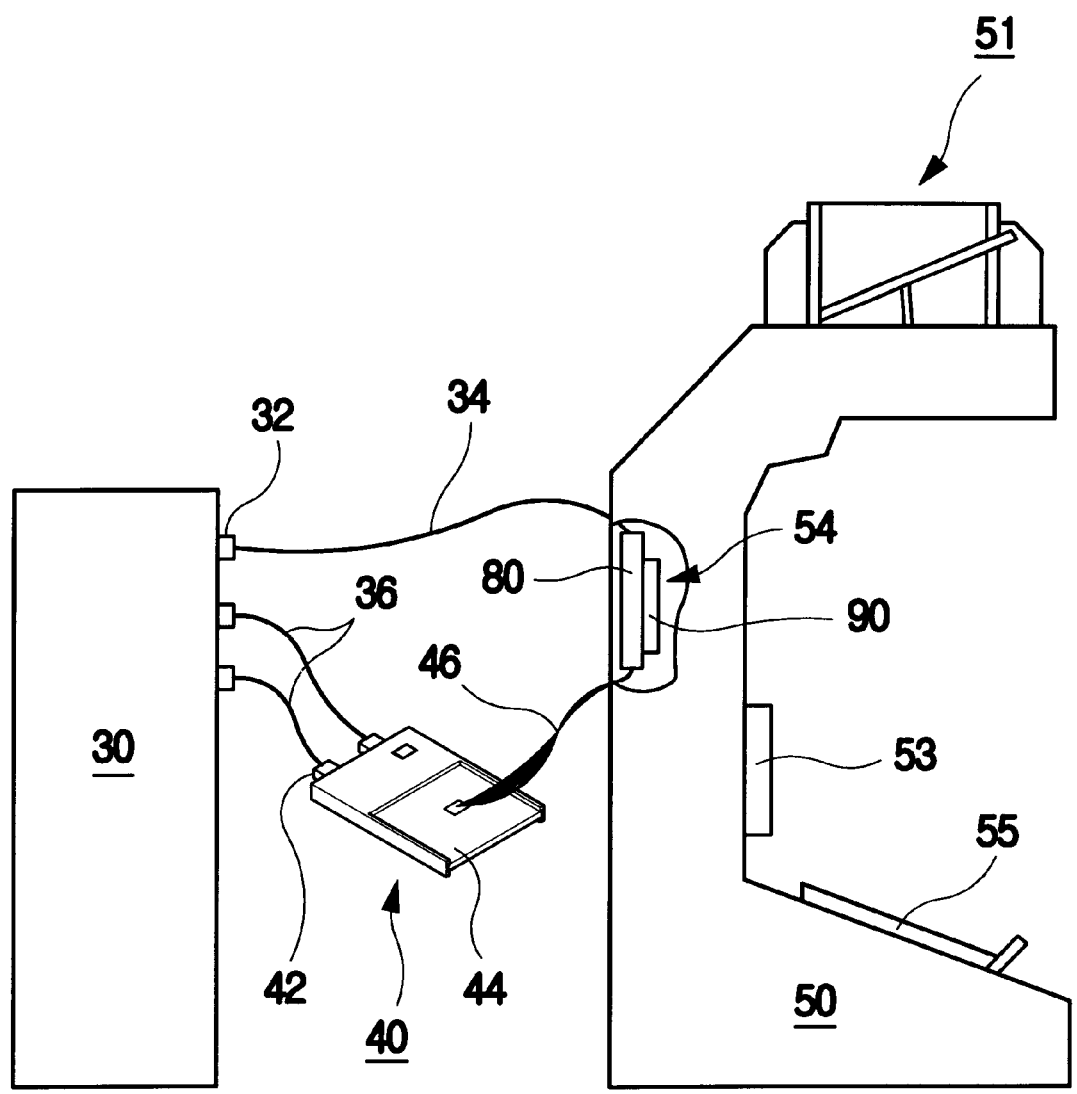
FIG. 3A is a schematic diagram of a test system for showing the operation of handler contact checking device according to the present invention.
Figure 3B:
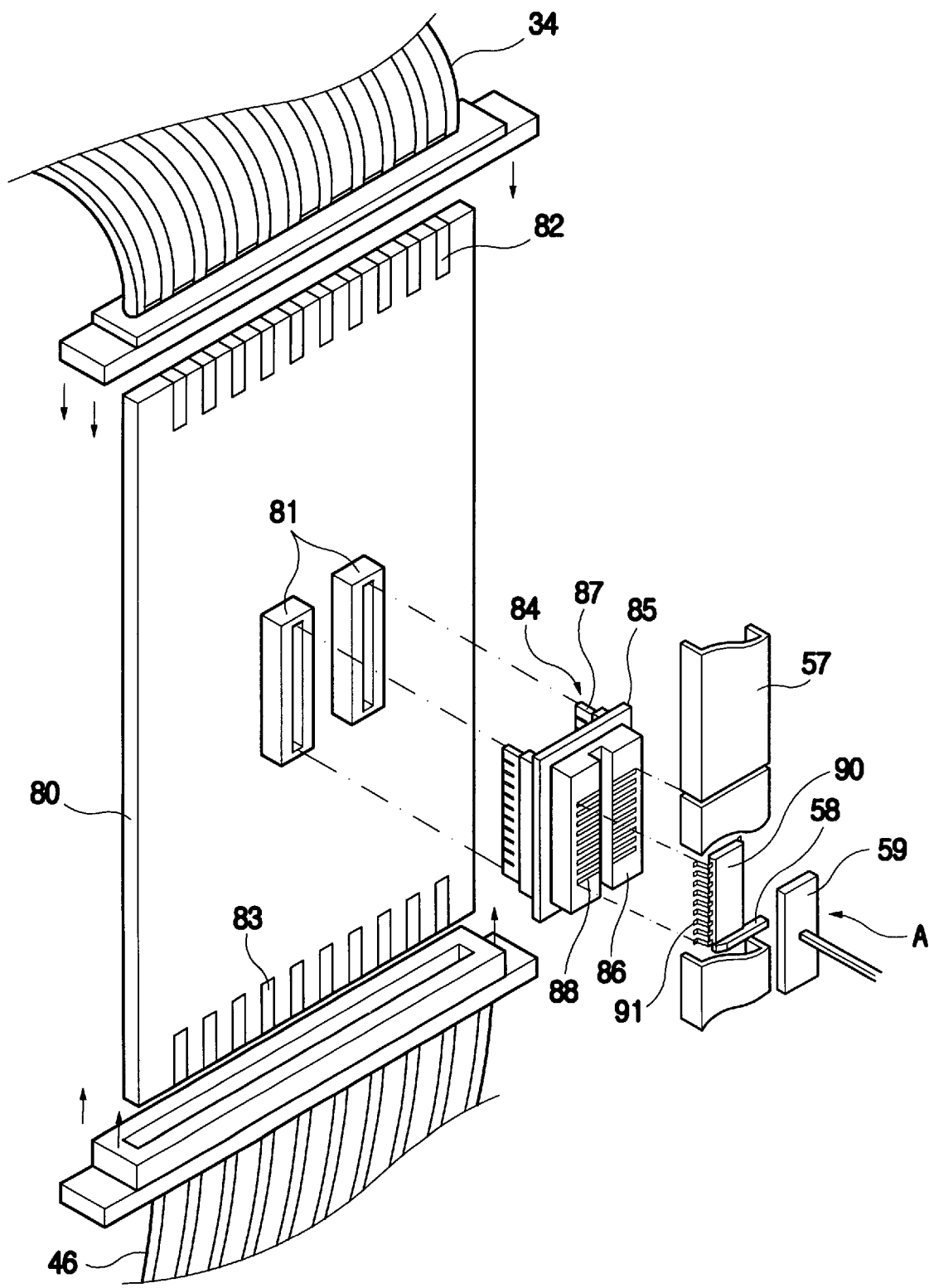
FIG. 3B is a partial enlarged view of the handler contact check board and contact check package device of the test system as shown in FIG. 3A.

FIG. 3A shows the operation of a handler contact checking device according to the present invention, and FIG. 3B is partial enlarged view of the handler contact check board and contact check package device of FIG. 3A. Referring to FIG. 3A, test apparatus 30 provides various test signals to an IC device to be tested. Test apparatus 30 also measures the output signals from the IC device to determine whether the IC device is functioning properly or is defective. To accomplish these tasks, the test apparatus 30 comprises, for example, a voltage/current source, a subsystem which can supply and measure analog signals ranging from DC to several hundred KHz and higher frequency signals, a measuring module which can detect the period, time interval and rise time of the output wave, and a microprocessor for controlling the overall operation of the test using predetermined test programs.

Electrical signals from the signal pins 32 of the test apparatus 30 are input to adaptor pin 42 of an adaptor 40 through an analog cable 36. The adaptor pins 42 are electrically interconnected to an interface board 44, and the interface board 44 is connected to a handler contact check board 80 via a flat cable 46. At the same time, RF signals from the test apparatus 30 are directly supplied to the handler contact check board 80 through RF cable 34.

The handler 50 comprises a device loading part 51 for automatically and sequentially loading the IC devices to be tested to a testing part 54. The testing part 54 is where the IC device to be tested is fixed. A sorting part 53 and an unloading part 55 sort the tested devices according to whether the IC device passes or fails the test as implemented by the test apparatus 30.

Referring to FIG. 3B, the handler contact check board 80 is provided with wiring circuits (not shown) that are necessary to check the handler contact. The RF and flat cables 34 and 46 are respectively connected to edge connectors 82 and 83 of the handler contact check board 80, and electrical signals supplied from the test apparatus 30 via the edge terminals 82 and 83 are input to a connector 81 through the wiring circuits of the handler contact check board 80. The connector 81 is connected to a socket assembly 84 which comprises a connecting plate 87 that inserts into or contacts the connector 81, a socket substrate 85, and a socket 86. The terminals (e.g., outer leads) 91 of the IC device to be tested actually contact the socket leads 88 of the socket 86. A handler contact failure is mainly due to the failure of this contact part between the socket leads 88 and the outer terminals 91.

Since the handler contact parts are checked (step 23 in FIG. 2) before the actual testing operation (step 25 in FIG. 2), the device 90 shown in FIGS. 3A and 3B is not the actual IC device to be tested but a packaged device, namely, a contact check package device, having the same shape, dimension and outer terminals 91 as the actual IC device to be tested. The contact check package device 90 is dropped along the chute 57 by the device loading part 51 of the handler 50. The contact check package device 90 is stopped by the stop plate 58 and inserted into the socket 86 by the pushing loader 59 moving along the direction of arrow A.

The contacts between the socket leads 88 and the terminals 91 of the contact check package device 90 may be a surface contact type or a pin insert type depending on the shape of the terminals 91. If the contact check package device 90 is of the small outline gull wing (SOP) type as shown in FIG. 3B or the small outline J-bend (SOJ) type, the contacts are considered to be surface contacting. If the contact check package device 90 is a dual in-line package (DIP) or zig-zag in-line package (ZIP), the terminals 91 contact the socket leads 88 in a pin insertion manner. For ease of discussion, the contact between the socket leads 88 and the outer terminals 91 is referred to as the "handler contact parts" or "contact parts".

When the contact check package device 90 is completely mounted on the handler contact check board 80, the test apparatus 30 first provides electrical signals via the cables 34 and 46 and then measures the output signals to check the handler contact parts. If DC signals are supplied by the test apparatus 30, the open (good) or short (contact failure) condition of the contact parts can be detected. The exact contact condition can be detected by using high frequency RF signals to measure the frequency of the output signals, which vary according to the capacitances of the contact parts.

In the present invention, it is preferable to design the handler contact check board 80 to have contact check wiring circuits for interfacing both DC and AC signals between the test apparatus and the contact parts, and various application circuits used in the actual testing operation. However, some IC devices require very complicated application circuits for the actual testing and it is thus burdensome to implement the contact check wiring circuits and the test application circuits on a single handler contact check board 80. In such cases, a separate contact check board is used to check the handler contact conditions. Then, prior to actual testing, the handler contact check board 80 is removed from the handler 50 and replaced with a test board having the predetermined test application circuits. After the test board is completely mounted onto the handler 50, the IC devices to be tested are loaded to the test station part 54 of the handler 50 for the actual test operation. It is noted that the handler contact check board 80 and the actual test board have the same shape and mounting locations.

Figure 4:
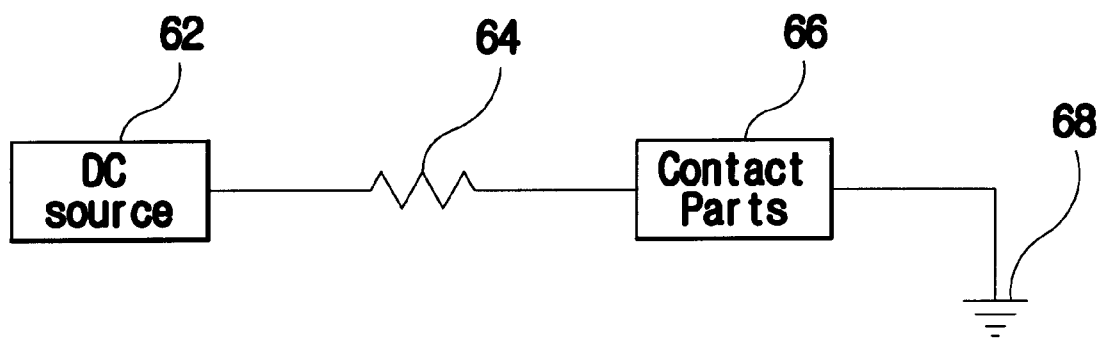
FIG. 4 is a circuit diagram of a handler contact check circuit applying DC signals to the contact parts.

FIG. 4 is a circuit diagram of a handler contact check circuit applying DC signals to the contact parts. In the DC check circuit 60, contact parts 66 correspond to the location where the pins of the handler 50 (i.e., leads 88 of the socket) and the outer terminals 91 of the IC device contact each other. The contact parts 66 are equivalent to resistors when DC signals are provided. The resistor 64, which may be formed, for example, on the handler contact check board 80, is connected between the DC source 62 and the contact parts 66. The DC source 62 contained in the test apparatus 30 supplies a positive voltage signal through the flat cable 46. If one end of the contact parts 66 is connected to the ground terminal 68, a current flowing through the contact parts 66 can be measured. By using this measured current value, the resistance Rc of the contact part 66 can be calculated by:

$$Rc = \frac{DC \text{ voltage}}{\text{measured current}} - 1 K\Omega \quad (1)$$

If the contact is failed or opened, the resistance Rc is very large. If the contact is good, Rc approaches zero.

Figure 5:
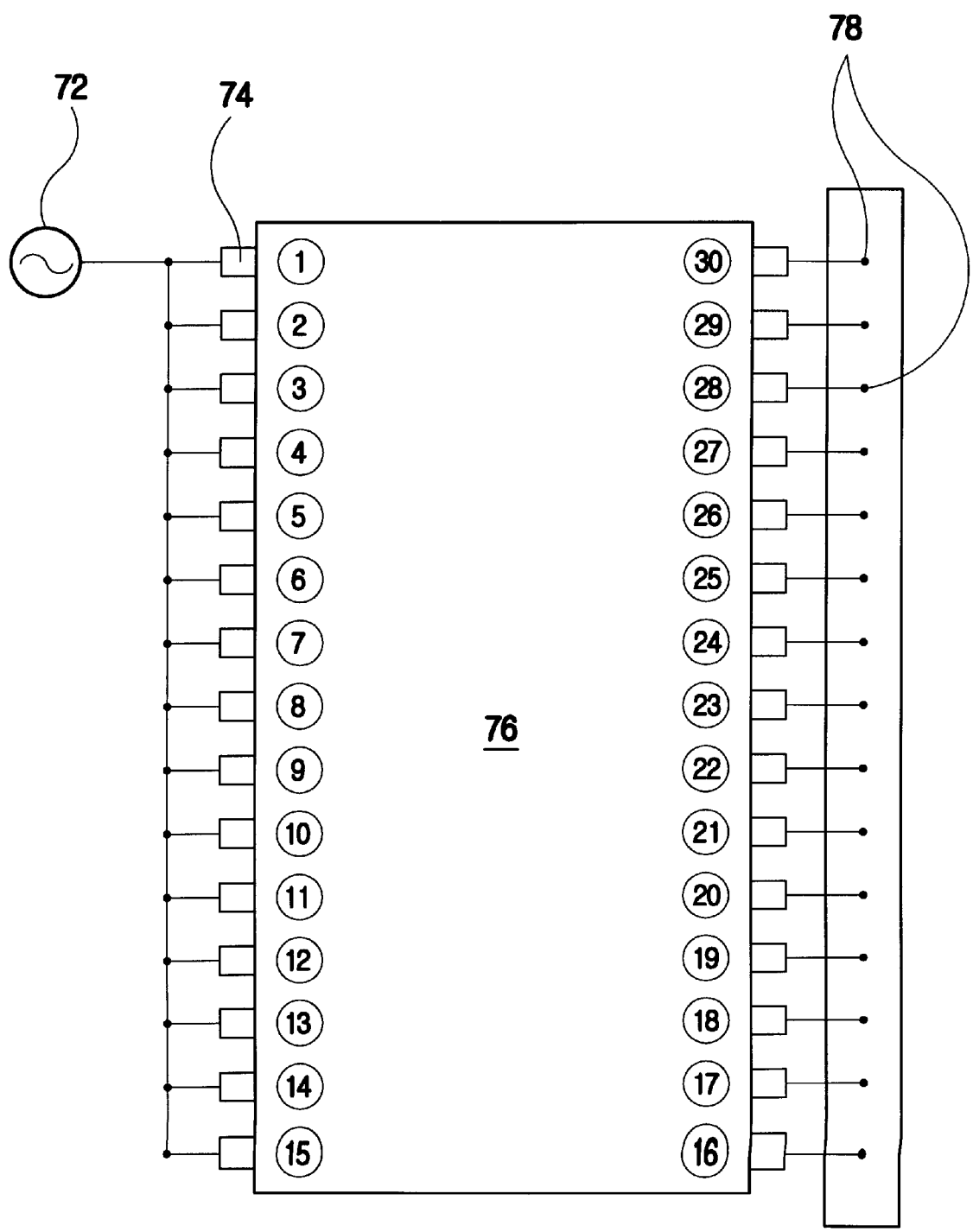
FIG. 5 is a circuit diagram of a handler contact check circuit applying AC signals to the contact parts.

FIG. 5 is a circuit diagram of the handler contact check circuit 70 which uses AC signals. AC source 72, which generates a 100 mV, 1 KHz signal, is connected to outer terminals 1 to 15 of the handler contact check package device 76. The remaining terminals 16 to 30 are connected to a voltage measure tool 78. Contact parts 74 is where the terminals of the contact check package device contact the pins of the handler (i.e., leads 88 of the socket 86). In a technique similar to the DC measurement, the AC check circuit 70 applies an AC voltage signal to the contact parts 74 and then checks the voltage drop across the contact parts 74 to determine the resistance Rc of the contact parts 74. If the contact is failed or opened, the resistance Rc is very large. If the contact is good, Rc approaches zero.

If the IC devices to be tested operate in a high frequency band, a capacitance of the contact must be considered in the handler contact check because the frequency is greatly influenced by the capacitance. The frequency (f) and the capacitance (C) has the following relationship:

$$f = \frac{1}{2\pi}\sqrt{\frac{1}{LC}} \quad (2)$$

As seen from equation (2), the frequency (f) is inversely related to the capacitance (C) of the contact. However, actual experimental results show that the measured frequency does not exactly follow the relationship in equation (2), but approaches the applied frequency when the capacitance is relatively small. When the capacitance is large due to the failure of the handler contact, the frequency is not measured normally. Accordingly, if the frequency value can be measured, read out, and approximates the applied frequency, the handler contact is determined to be good, whereas if the measured frequency value deviates sufficiently from the applied frequency, the handler contact is determined to have failed.

Figure 6:
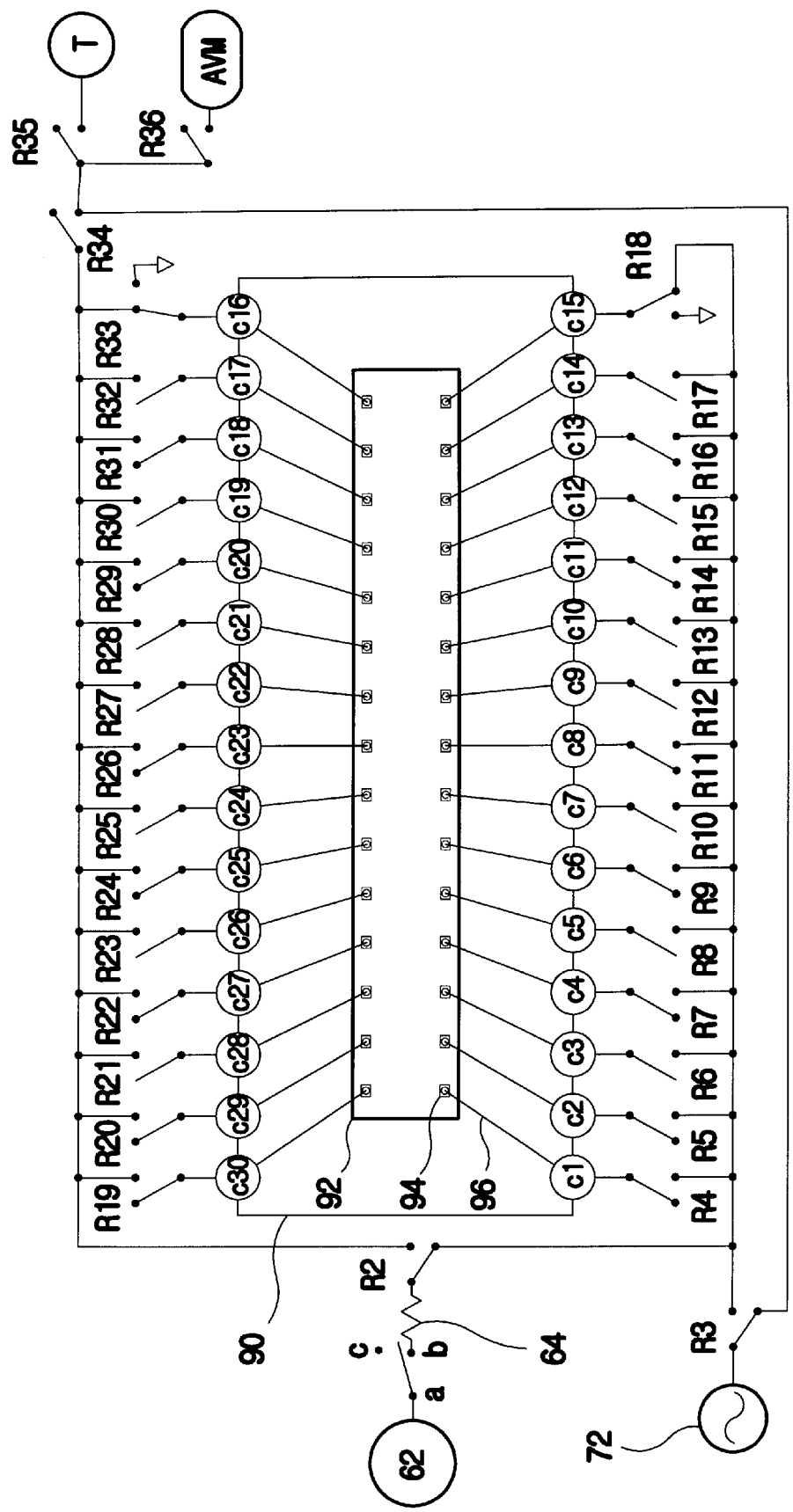
FIG. 6 is a circuit diagram of an embodiment of the handler contact check device according to the present invention.

FIG. 6 is a circuit diagram of the handler contact check device according to one embodiment of the present invention. Relays R1 to R38 are switching elements having three terminals a, b and c as shown, for example, in relay R1. In the initial "off" state, the relay switch contact is connected between terminals a and c. When a voltage difference has occurred across terminals a and b, an electrical current flows through the terminals a and b and thus the switch contact is connected between the terminals a and b ("on" state). The control of the switch contact connection is accomplished, for example, by controlling the voltage difference across the terminals a and b of the relay by a test apparatus.

For a handler contact check using a DC signal, the relay R3 associated with the AC source 72 is turned off, and the relay R1 associated with the DC source 62 is turned on so that DC voltage signal can be supplied through the resistor 64. The handler contact check package device 90 in FIG. 6 consists of, for example, 30 SOP type pins, and the contacts c1 to c30 are the contacts between the outer terminals 91 of the contact check package device 90 and the socket leads 88 of the handler 50. Since the contacts c1 to c30 are connected to pads 94 of a conductive substrate 92 via bonding wires 96, the contacts are all electrically shorted.

To check the contacts c1 to c15, relay R2 is turned on. Thereafter, the relays R4 to R18 are turned on, one after the another, so that the DC source is selectively connected to the contacts. For example, when the contact c6 is to be checked, relay R9 is turned on among the relays R4 to R18 so that a current path is formed through the DC source 62, the relay R1, the resistor 64, the relays R2 and R9, the conductive substrate 92, the contact c16 and the relay R34 to the ground terminal. This current can be measured by the DC source 62. If the contact c6 is good, the measured current is relatively large and the resistance of the contact Rc approaches zero according to equation (1) above. On the other hand, if the contact between the outer terminals 91 of the contact check package device 90 and the socket leads 88 of the handler 50 are misaligned, the measured current is very small and, consequently, the resistance Rc of the contact becomes very large.

Similarly, to check the contacts c16 to c30, a current is measured after turning off relay R2 and serially turning on relays R19 to R33, one after another.

During an AC check, the DC source 62 is disconnected by turning off relay R1 and turning on relay R3 so that the AC source 72 is connected to the contact check package device 90. For example, when a sine wave of 100 mV and 1 KHz is supplied by the AC source 72, the relays R4 and R19 are turned on to enable a signal transfer path for checking contacts c1 and c30. In measuring the voltage on the contacts c1 and c30, an audio voltage meter AVM is used by turning on relays R34 and R36. If the handler contact is good, the AVM can read the voltage applied by the AC source 72.

In order to check the contacts of high frequency IC devices, the capacitance of the contact should be taken into consideration. To accomplish this, a RF signal is supplied by the AC source 72 and the relays associated with the contacts c1 to c30 are controlled in a similar manner as described above for an AC check. To measure the frequency, relay R35 is turned on so that timer T is connected to the circuit. The measured frequency value as determined by the timer T depends on the capacitance of the contact as shown in the equation (2). However, as explained previously, the measured frequency does not exactly follow equation (2) in actual experiments, but rather has relatively the same measured value as the applied frequency when the capacitance of the handler contact is relatively small. When the capacitance is large due to the failure of the handler contact, the timer T cannot read the applied frequency. Accordingly, if the frequency value can be measured and read out, the handler contact is determined to be good, whereas if the frequency value cannot be read out, the handler contact is determined to have failed. For example, when a RF signal of 200 mV and 1 MHz is supplied by the AC source 72, and the measured frequency by the timer T is 1 MHz, the contact is determined to be good. However, if the measured frequency is read out as 200 KHz, the contact is determined to have failed, and proper corrective action is taken to solve this failure before the actual test operation is commenced.

With the present invention, therefore, it is possible to reduce the overall test time and thus to improve the production yield of the IC devices by determining whether or not there is a contact failure between the handler and the IC devices to be tested, prior to the start of the actual test operation.

While this invention has been described with reference to illustrative embodiments, this description is not intended to be construed in a limiting sense. Various modifications and combinations of the illustrative embodiments, as well as other embodiments of this invention, will be apparent to persons skilled in the art upon reference to the description. It is therefore intended that the appended claims encompass any such modifications or embodiments.

We claim:

1. A test method for testing an integrated circuit (IC) device, said test method comprising the steps of:
   (A) setting up a test apparatus for providing power signals and test signals to the IC device, measuring output signals from the IC device, and determining whether the IC device meets predetermined operating standards;
   (B) setting up a handler, which comprises pins for contacting external terminals of one of the IC device or a contact check package device, said handler operable for loading IC devices to be tested and sorting a tested IC device based on the operating standards in the determining step of the test apparatus;
   (C) loading the contact check package device, having the same shape and external terminals as the IC device, into the handler;
   (D) checking contact parts between the external terminals of the contact check package device and the pins of the handler to determine whether the handler pins are operating in a normal condition;
   (E) if the handler pins are operating in a normal condition in step (D), performing a preliminary test of the handler itself after removing the contact check package device and loading the IC device to the handler;
   (F) if the handler itself is operating in a normal condition in step (E), performing an actual test of the IC device; and
   (G) sorting the tested IC device depending on results of the performing step (F).

2. The test method as claimed in claim 1, wherein the step of checking the contact parts comprises steps of: applying a DC voltage signal to the contact parts; measuring an electrical current flowing through the contact parts; calculating a resistance value of the contact parts; and determining a good or failed contact state based on the resistance value.

3. The test method as claimed in claim 2, wherein during the determining step, the resistance value approaches zero if the contact is good and the resistance value is large if the contact has failed.

4. The test method as claimed in claim 1, wherein the step of checking the contact parts comprises steps of: applying a AC voltage signal to the contact parts; measuring a voltage value drop across the contact parts; calculating a resistance value of the contact parts; and determining a good or failed contact state based on the resistance value.

5. The test method as claimed in claim 4, wherein during the determining step, the resistance value approaches zero if the contact is good and the resistance value is large if the contact has failed.

6. The test method as claimed in claim 1, wherein the step of checking the contact parts comprises steps of; applying a signal to the contact parts; measuring a frequency of the signal passing through the contact parts; and determining good or failed contact states of the contact parts based on the measured frequency value.

7. The test method as claimed in claim 6, wherein during the determining step, if the frequency value can be measured, read out, and approximates the applied frequency, the handler contact is determined to be good, whereas if the measured frequency value deviates sufficiently from the applied frequency, the handler contact is determined to have failed.

8. The test method as claimed in claim 1, wherein after the step of performing the preliminary test of the handler itself, the method further comprises steps of: taking corrective action if the handler is determined to be in an abnormal operating condition; and returning to the step of checking the contact parts after taking the corrective action.

9. The test method as claimed in claim 1, wherein the step of checking the contact parts comprises the steps of: mounting a handler contact check board onto the handler, said handler contact check board having wiring circuits which are electrically connected to the contact parts for supplying and receiving electrical signals to and from the test apparatus; contacting the external terminals of the contact check package device and the pins of the handler; and checking whether the contact parts are good or failed.

10. The test method as claimed in claim 9, wherein after the step of checking whether the contact parts are good or failed, the method further comprises steps of: removing the handler contact check board; and mounting a test board onto the handler, said test board having circuits suitable for testing the IC devices.

* * * * *